US011419219B2

(12) United States Patent
Kowalczewski et al.

(10) Patent No.: US 11,419,219 B2
(45) Date of Patent: Aug. 16, 2022

(54) METHOD FOR REPAIRING CONDUCTOR TRACKS

(71) Applicant: XTPL S.A., Wroclaw (PL)

(72) Inventors: Piotr Kowalczewski, Wroclaw (PL); Aneta Wiatrowska, Wroclaw (PL); Michal Dusza, Wroclaw (PL); Filip Granek, Wroclaw (PL)

(73) Assignee: XTPL S.A., Wroclaw (PL)

( * ) Notice: Subject to any disclaimer, the term of this patent is extended or adjusted under 35 U.S.C. 154(b) by 0 days.

(21) Appl. No.: 16/972,094

(22) PCT Filed: Jun. 5, 2019

(86) PCT No.: PCT/EP2019/064622
§ 371 (c)(1),
(2) Date: Dec. 4, 2020

(87) PCT Pub. No.: WO2019/234089
PCT Pub. Date: Dec. 12, 2019

(65) Prior Publication Data
US 2021/0227700 A1 Jul. 22, 2021

(30) Foreign Application Priority Data
Jun. 6, 2018 (GB) ........................................ 1809311

(51) Int. Cl.
*H05K 3/22* (2006.01)
*H05K 3/46* (2006.01)

(52) U.S. Cl.
CPC .............. *H05K 3/225* (2013.01); *H05K 3/222* (2013.01); *H05K 3/4685* (2013.01);
(Continued)

(58) Field of Classification Search
CPC ... H05K 2203/0126; H05K 2203/0776; H05K 2203/105; H05K 2203/11115;
(Continued)

(56) References Cited

U.S. PATENT DOCUMENTS 3,240,866 A * 3/1966 Jarnagin ................ H05K 3/225
174/254
7,732,002 B2 * 6/2010 Kodas ..................... H05K 3/046
427/58
(Continued)

FOREIGN PATENT DOCUMENTS

WO WO-2017162696 A1 * 9/2017 ........... H01L 21/326

*Primary Examiner* — Brian K Talbot
(74) *Attorney, Agent, or Firm* — Taft Stettinius & Hollister LLP; Ryan O. White; Derek B. Lavender

(57) ABSTRACT

A method for modifying an elongate structure including providing a fluid deposited onto the substrate, the fluid containing a dispersion of electrically polarizable nanoparticles and applying an AC voltage across a portion of the elongate structure so as to cause an alternating electric current to pass through the narrow section such that a break in the elongate structure is formed at the narrow section, the break being defined between a first broken end and a second broken end of the elongate structure, and then cause, when the break is formed, an alternating electric field to be applied to the fluid such that a plurality of the nanoparticles contained in the fluid are assembled to form a continuation of the elongate structure extending from the first broken end towards the second broken end so as to join the first and second broken ends.

12 Claims, 6 Drawing Sheets

(52) U.S. Cl.
CPC ........... *H05K 2203/0126* (2013.01); *H05K 2203/0776* (2013.01); *H05K 2203/105* (2013.01); *H05K 2203/1115* (2013.01); *H05K 2203/1131* (2013.01); *H05K 2203/1476* (2013.01); *H05K 2203/163* (2013.01); *H05K 2203/173* (2013.01)

(58) Field of Classification Search
CPC ... H05K 2203/1131; H05K 2203/1476; H05K 2203/163; H05K 2203/173; H05K 3/222; H05K 3/225; H05K 3/4685
USPC ................. 427/142, 458, 532, 591
See application file for complete search history.

(56) References Cited

U.S. PATENT DOCUMENTS

| | | | |
|---|---|---|---|
| 10,731,268 B2* | 8/2020 | Granek | H05K 3/1283 |
| 2003/0048619 A1* | 3/2003 | Kaier | H01L 33/20 |
| | | | 361/760 |
| 2010/0052697 A1* | 3/2010 | Knippelmeyer | H05K 3/225 |
| | | | 324/537 |
| 2018/0111829 A1* | 4/2018 | Sam | C25D 13/22 |
| 2018/0163299 A1* | 6/2018 | Zhou | C25D 13/02 |
| 2019/0106804 A1* | 4/2019 | Granek | C25D 13/22 |

* cited by examiner

METHOD FOR REPAIRING CONDUCTOR TRACKS

This application is a U.S. National Phase of PCT/EP2019/064622 filed on Jun. 5, 2019, the contents of which being incorporated herein by reference in entirety.

FIELD OF THE INVENTION

The present invention relates to a method of modifying an elongate structure, to an assembly comprising a substrate having an elongate structure formed upon it, and to an apparatus for modifying an elongate structure upon a substrate.

BACKGROUND TO THE INVENTION

Electrical circuits are becoming smaller and more complex. The demand for miniaturization requires conductive lines to be, firstly, thinner, with a preferable width less than one micrometre, and secondly, densely packed, that is with reduced distance between lines. One of the most common issues encountered in the fabrication of such conductive lines, which may also be referred to as elongate structures, is the presence of near-open defects or bottlenecks. In these defects, the material of the elongate structure is locally absent and the line is thinner, or narrower, than intended. These defects have higher local electrical resistance and are less resistant to mechanical, thermal, and electromagnetic stress compared with wider or more uniform sections of these line structures. Therefore, a conductive line with these defects is likely to mechanically break or burn out in use. This has a detrimental effect on the whole line and significantly decreases its current load capability.

The problem of bottlenecks is common to a wide range of technologies that allow fabrication of conductive structures with widths ranging from tens of nanometres to one micrometre. Moreover, the importance and scale of the adverse impact of this issue increases with increasing lengths of conductive structures.

A known method of forming elongate structures upon a substrate is disclosed in F. Granek and Z. Rozynek, "Bottom-up method for forming wire structures upon a substrate", WO 2017/162696 A1, 28 Sep. 2017.

The mechanism that underlies the assembly of nanoparticles within a fluid into an elongate structure according to this known approach is dielectrophoresis (DEP) action. In its broadest form, this phenomenon involves the exertion of a force upon a dielectric particle in the presence of a non-uniform electric field. The application of an alternating field, that is an AC field, across a region of fluid containing electrically polarizable particles leads to a dielectrophoretic force being felt by the particles. Dielectrophoresis does not necessarily require an AC field, and DC dielectrophoresis effects may be created using DC fields also, not least since it is the field gradient which gives rise to the particle movement. However, the application of alternating fields may avoid some deleterious effects associated with DC dielectrophoresis, such as the disruption of the assembly process by electrolysis.

Typically, in dielectrophoretic (DEP) particle assembly, the force arises via interaction between the gradient of an inhomogeneous electric field and electric dipoles which are induced in the particles by the alternating field. Thus dielectrophoretic forces are exerted upon the particles, these forces comprising a first component resulting from an attractive electrostatic interaction between the dipoles directed along the direction of the electric field lines, which may result in a chaining effect, and a component arising from the dipole-non-uniform AC field interaction, being directed along the field gradient and typically leading to a concentration of particles being assembled at the end of a growing elongate structure.

A fluid with nanoparticles dispersed within may be thought of as a fluid ink. The application of an electric field to nanoparticles within a deposited drop or line of fluid ink gives rise to nanoparticles agglomerated at the end of an electrode and aggregating directionally so as to cause an elongate structure made of nanoparticles to grow in the direction of the electric field gradient. These elongate structures, which are made from particles having diameters in the order of nanometres, typically have dimensions of the order of 10s, 100s or 1000s of nanometres in height and width, and it is therefore this phenomenon which contributes to the ability of this approach to produce ultra-narrow line structures.

In some applications, the nanoparticles provided in the fluid may comprise an electrically conductive material such as silver or gold. Typically the material of the nanoparticles is selected such that the electrical conductivity of the nanoparticles during the method is greater than $1 \times 10^6$ Sm$^{-1}$. More preferably the conductivity of the nanoparticles is greater than $3 \times 10^7$ Sm$^{-1}$, or more preferably still, greater than $4 \times 10^7$ Sm$^{-1}$. These are preferable ranges for the conductivity of the nanoparticles, however, and nanoparticles that are less electrically conductive may also be used in the method. In some applications the nanoparticles may comprise a semiconducting material. Many suitable semiconductor materials are known, which may be formed into nanoparticles suitable for use with the method of the invention in cases where a semiconducting elongate structure or pattern is required. The nanoparticles may comprise, for example, one or more of: ZnO, TiO$_2$, CdTe, CdS, copper indium gallium (di)selenide (CIGS), or a combination of core-shell nanoparticles. WO 2017/162696 A1 explains, at the passages from the penultimate paragraph on page 28 to the first paragraph on page 30, how these different materials may be used.

Typically, the fluid used in DEP assembly comprises a solvent, a surfactant, and an organic binder. The composition of the fluid is selected such that the formed lines are not broken during the drying process. This is effected via altering the surface tension of the fluid by the use of additives in the fluid.

The solvent, which is a principal or main component of the fluid composition, by mass, may be either polar or non-polar, or may be a mix of solvents. The different solvents which may be used may have different boiling temperatures. However, the fluid composition is typically selected such that, while the fluid may be made to readily evaporate during the drying process of the method, the fluid does not evaporate before the entire structure within a wetted region is assembled, as this premature drying would adversely impact the formation process.

Typically, in addition to the solvent component, the fluid may further comprise, similarly to inkjet or screen printing inks, a surfactant and an organic binder, or one of these two. The surfactant has the function of reducing the surface tension of the fluid, even in the case that it exists in very small amounts within the fluid such as a mass fraction of 0.01% to 10%. A typical surfactant may be Triton X-100, which a commercially available surfactant. The organic binder may improve the adhesion of the formed structure to the surface during the drying process. An example of a suitable organic binder is glucose. The organic binders present in the fluid function as a glue or adhesive that improves the adhesion of the assembled structure to the substrate. In some embodiments, this process may require increased temperature levels, typically by a range of 50° C. to 500° C., and more preferably between 100° C. and 250° C.

The mass fraction of the nanoparticles within the fluid may typically be in the range 0.01% to 10%. More preferably, the mass fraction of the nanoparticles within the fluid is in the range 0.02% to 5%.

The DEP printing technique further allows elongate nanoparticle structures to be formed having widths of less than 1 micrometre for instance. Widths of 250 nanometres and smaller are achievable using the DEP line forming method.

This approach provides the advantage that, even for relatively wide wetted regions, for example those having widths of 100 micrometres, the DEP printing method allows the formation of ultra-narrow lines less than 1 micrometre in width therein.

It will be understood that dielectrophoretic (DEP) self-assembly as employed by these prior art approaches and also the present invention is an entirely different phenomenon from, and provides advantageous effects not provided by, electrohydrodynamic (EHD) self-assembly. The key difference between DEP and EHD is that, in the former, an external electric field acts on nanoparticles within the fluid, whereas in the case of EHD an external electric field acts upon a fluid. The implementation of each of these methods also differs. EHD printing requires a substrate to be placed between the electrodes applying the electric field, with the top electrode typically positioned a few micrometres above the substrate surface. If the thickness of the substrate is too great, or if the distance between the top electrode and the substrate surface is too great, the voltage required in order to effect the EHD assembly process will typically become prohibitively large. A further limitation of EHD is that this method is only suitable for printing upon flat surfaces, or surfaces having substantially low surface roughness, in order to keep the fixed distance between the top electrode and the substrate at the precisely required level.

A further distinction between DEP techniques and EHD is that, in the former, elongate structures or lines may be printed in a single run, producing structures with a reasonably high "height to width" aspect ratio. On the other hand, EHD techniques operate by building up lines layer by layer, since each layer is approximately the height of a single nanoparticle diameter. This is typically 70-100 nm. Thus the assembly or printing speed is fundamentally limited, as is the scalability of the EHD process, in particular if thicker lines, e.g. of around 500 nm in height are required.

In some DEP printing methods according to the prior art, during the step of applying the alternating electric field, the method involves increasing the separation between first and second electrodes so as to further extend an elongate structure towards the second electrode. In other words, moving one or both of the electrodes so that the distance between them increases causes the elongate structure to grow in length by the addition of extra particles to an end of the structure at an assembly region proximal to the moving electrode.

An advantage of this is seen when the second electrode is moved, while the first electrode remains in its initial position, and when the strength of the applied electric field is adjusted so that the growth rate of the assembly of nanoparticles may remain constant. The aggregation of particles to the growing end of an elongate structure may result in a constant growth rate and structures that are substantially uniform in their cross-sectional size and shape, that is their thickness, height, width or cross-sectional area in a plane perpendicular to the elongate axis, that is the direction of growth. Where a constant or uniform growth rate is maintained, the resulting morphology of a formed structure may also be uniform. It is therefore additionally advantageous to keep the growth rate and electric field conditions uniform over longer distances, in order to achieve more uniform structures.

This known technique therefore provides a novel and advantageous way of printing ultra-fine structures on a surface or substrate by moving one of the electrodes around the surface. This method contrasts with nanoparticle assembly techniques, in which fixed, that is non-movable, electrodes do not provide the printability afforded by the moving electrode approach. In other words, the ability to move one of the electrodes freely so as to create large or complex patterns formed from elongate structures provides an advantage. With other previous techniques only small structures may be formed by self-assembly, with line lengths typically below 1 millimetre.

DEP line printing employing a moving electrode makes it possible to print elongate nanomaterial with sub-micrometre line widths. This makes it possible to print structures without any particular length or size limit. For example, sub-micrometre lines assembled from nanoparticles may be formed having lengths in the order of several centimetres. The free movement of the electrode during the assembly process allows an advantageous degree of freedom over the size and shape of the printed structures, thereby overcoming the limitation to assembling straight lines only which is seen in prior art assembly techniques.

An example method for forming structures upon a substrate using dielectrophoresis and moving a second electrode is described in WO 2017/162696 A1 at the passages from the final paragraph on page 40 to the penultimate paragraph on page 44.

Although this known technique is able to produce or print ultra-narrow elongate line structures, the problem of bottlenecks affects these structures also.

In particular, the process of nanoparticle assembly using an alternating electric field includes a degree of randomness or unpredictability. During the growth, the electric field at the front of the growing line constantly changes, meaning that the number of attracted nanoparticles varies over time. Moreover, the ink is not, and cannot be, fully uniform in terms of the distribution and positions of nanoparticles and also their sizes. As a result, the conductive structure will not be uniform in width as it is being formed and bottlenecks are likely to appear.

Furthermore, it is possible that the defects propagate during the line growth, that is by way of initial non-idealities or defects causing more non-idealities later. In such cases, the line assembly would be very sensitive to initial conditions and forming lines of uniform width rendered more difficult.

There is therefore a need for a method that allows bottlenecks to be removed when fabricating such submicron conductive elongate structures.

SUMMARY OF THE INVENTION

In accordance with the invention there is provided a method of modifying an elongate structure, the method comprising: providing on a substrate an elongate structure formed of assembled electrically polarizable nanoparticles, the elongate structure including a narrow section to be modified; providing a fluid deposited onto the substrate, the fluid containing a dispersion of electrically polarizable nanoparticles and being positioned so that at least the narrow section of the elongate structure is immersed therein; and applying an AC voltage across a portion of the elongate structure that includes the narrow section using a first electrode in contact with the elongate structure at a first end of the portion and a second electrode in contact with the elongate structure at a second end of the portion, so as to: cause an alternating electric current to pass through the narrow section such that a break in the elongate structure is formed at the narrow section, the break being defined between a first broken end and a second broken end of the elongate structure, and then cause, when the break is formed, an alternating electric field to be applied to the fluid such that a plurality of the nanoparticles contained in the fluid are assembled to form a continuation of the elongate structure extending from the first broken end towards the second broken end so as to join the first and second broken ends.

The inventors have found, surprisingly, that contrary to prior art methods of dielectrophoretic structure assembly methods, which focus upon optimizing the process parameters so as to maximum the robustness and uniformity of the structure as it is initially formed, it is possible to modify an elongate structure formed using DEP so as to make it more robust by intentionally subjecting the structure to physical stress, or some form of physically disruptive force or action, through exposing it to unfavourable conditions. Process parameters may be applied that cause this stress factor, which is closely related to the electric current passing through the elongate structure, to be sufficiently low to allow the structure to recover and repair itself by way of dielectrophoretic action after it has been broken by the stress. This modification process, which may be thought of as a line tempering procedure, increases the robustness or width/thickness uniformity of an elongate line structure formed from electrically polarizable nanoparticles by way of causing comparatively narrow sections of the line to be broken and subsequently restored with increased width or thickness.

This advantageous modification may be achieved by way of properly modulating or applying an electrical signal that causes the line to form, such that the same signal applied at an AC voltage for example can cause an elongate line structure to break at one or more weak points as well as causing dielectrophoretic action to take place in the gaps left by those broken weak points when those gaps are enveloped or contained within fluid within which electrically polarizable nanoparticles are distributed or dispersed.

Typically, the dimensions of the provided elongate structure are such that the width of the structure at its widest point is less than 1 μm. Structures, or portions thereof, having such maximum or average widths of less than 1 μm, 800 nm, 600 nm, 400 nm, or 250 nm, each having lengths which may be of the order of several millimetres, 1 cm, 5 cm or greater may be formed by dielectrophoretic assembly methods according to the prior art referred to above, and may also be modified according to the method of this disclosure. Wider structures may also be provided for modification by the disclosed method. Structures having different maximum or average widths may be provided in various embodiments, and these widths may be between 1 μm and 10 μm. The elongate structure may be formed from a material comprising assembled electrically polarizable nanoparticles. Typically, the break may therefore be thought of as being defined by an absence of the material of the elongate structure between the first broken end and the second broken end. The break may also be defined as a discontinuity in the elongate structure, or in the electrical circuit comprising it.

The narrow section may typically be defined as a section of the structure that is narrow relative to the maximum or average width, thickness, or cross-sectional area of the elongate structure. In other words, the narrow section may be thought of as a part of the structure in which the narrowness, for example defined by the cross-sectional area perpendicular to the length or elongate axis of the elongate structure, is smaller than that of the average, maximum, or desired cross-sectional area for the remainder of the structure or the portion thereof. The narrowness may also be defined according to the diameter of the line, or its width or height, as measured perpendicularly to the elongate or length axis of the line at the point of measurement.

According to each of these definitions of narrow section, the section may be thought of as a bottleneck, that is a part of the structure that causes the overall structure to have high electrical resistance. The narrow section may therefore be defined as a section that has a comparatively higher electrical resistance, or the greatest electrical resistance in the line or the portion of the line, owing to the morphology of that section. It may also be thought of as a section to which the resistance of the structure is primarily attributable, by virtue of the morphology of the narrow, bottleneck section placing a limit upon the maximum current that the structure can carry. Bottlenecks in provided elongate structures may vary in their morphologies and in their widths relative to the overall elongate structure. In some cases, a bottleneck may have a linear width, across a transverse axis of the elongate structure, that is approximately 10% of the average or maximum width of the elongate structure. It will be understood that such narrow sections can have a significant limiting impact upon the electrical conductance of an elongate structure.

The narrow section may be identifiable as the section that is caused to heat up to the greatest degree, or to burn out, or to fail at a given current level. This may be caused by the relatively low cross-sectional area and consequently relatively higher electrical resistance compared with the remainder of the line, or compared with other sections of the line having a normal or desired or target width which may be able to withstand that given current without being caused to fail or break. Typically, the applied AC voltage is selected or modulated so as to cause these breaks to form in narrow bottleneck sections while, other, wider sections are heated less owing to their lower degree of local resistive heating, and can therefore remain intact at a given current level.

The narrow section may be caused to break down by either or both of resistive heating within the narrow section and capacitance. The inventors have found that too great a current or current amplitude causes a narrow section to break down. Occurrences of breaks forming in this way have been observed and are verifiable by inspection of scanning electron microscope images of portions of elongate structures to which such conditions are applied.

The inventors have noted that the formation of a break in a narrow section might be caused by heating, for example by being burned out and/or capacitance between the two ends of the first and second sides of the elongate structure, which are wider than the narrow section, disrupting the structure of the assembled nanoparticles.

The narrow section to be modified may be thought of as a narrow section to be repaired in some embodiments. Thus, the modification itself may be considered as a form of repair to an elongate structure, in a sense that the quality, dimensional uniformity, or physical robustness of the elongate structure may be improved by way of the modification.

Typically, the nanoparticles comprised by the dispersion of electrically polarizable nanoparticles contained in the fluid are the same as, or are formed of the same or similar material as the assembled electrically polarizable nanoparticles of the provided elongate structure. In some embodiments, this might be the case owing to a given volume or type of fluid being provided both for the purpose of forming the initially provided elongate structure and for forming continuations of the structure in gaps that are formed during the modification process.

It is also envisaged, however, that the modification may be carried out using a separate type of fluid, or a fluid containing a different type or material of electrically polarizable nanoparticles than those comprised by the provided elongate structure.

Typically, at least the narrow section of the elongate structure is immersed in the fluid. Thus in typical embodiments, the narrow section is surrounded by or has proximal to it a plurality of nanoparticles for being assembled so as to modify or repair the section once it has broken.

Typically, the applied AC voltage can be chosen based upon a target resistance. That is, the voltage may be configured so as to give rise to a current that would break a narrow section that has a width or cross-sectional area less than a target threshold, without damaging the wider remainder of the structure, or any sections whose width or cross-sectional area is at least as great as that configured threshold.

Preferably, the current that is caused to pass through the portion of elongate structure is sufficiently high to cause sintering in the portion. Thus, the structure of assembled nanoparticles may be caused to coalesce further into a solid, semi-solid or porous mass by means of heating caused by the electrical current through the structure. Although the elongate structure may be mechanically stable, notwithstanding the weaker, narrow sections, the sintering process allows individual nanoparticles to be fused. Complete liquefaction of nanoparticles should preferably be avoided, because this may damage the structure, for example by causing the formation of small droplets or islands instead of substantially cylindrical, fused elongate structures. The sintering results in the formation of a more firm and stable elongate structure with increased conductance so as to create an improved electrically conductive path. The increased durability, physical or tensile strength or resistance to breakage or damage which may thus result from sintering the structure is beneficial in many applications.

The portion across which the AC voltage is applied, that is the portion to which an alternating potential difference is applied, may be either part or all of the length of the elongate structure.

The break that is caused to form in the elongate structure may be thought of as an interruption in the electrical circuit of which the elongate structure may be considered as a component. Typically, the narrow section is disrupted by the sintering process or the resistive heating of the current passing through the structure so that nanoparticles in the narrow section break away, burn out, or are otherwise removed or displaced from their connective arrangement such that a gap is formed in the structure. This break or gap may be defined by an absence of the assembled nanoparticles, or the material of the elongate structure, between two broken ends of the elongate structure. The broken ends defining the gap may have various different morphologies, and may for instance be irregular in shape. In each case, independent of the particular broken end morphology that results from the breaking process, which may be somewhat random or unpredictable in nature, typically there is a physical separation or spacing apart between the two broken ends or any parts thereof such as electrical contact is broken or interrupted across the break or narrow section.

Typically, the first and second broken ends of the elongate structure are ends that are created or defined by the break having been formed in the structure. In other words, typically the first and second broken ends are separated from one another by the break being formed.

The linear extent, or the length of the break or gap that is formed may be equal to the whole length of the narrow section, or may be shorter than that of the narrow section such that a break forms in only part of the narrow section, typically the most narrow part. It is preferable for, in a particular incidence of a break being formed, the entire narrow section, that is the entire length of the section the width or cross-sectional area of which is smaller than a desired, average, or maximum value for the structure, to be broken, disrupted, or destroyed. This provides the opportunity for a continuation having a wider or more preferable or robust width to be formed along the entire length of the initial narrow section in a single self-repair step or cycle, rather than requiring multiple cycles in the case that only a part of the narrow section is broken at a time.

Typically, the application of the AC voltage causes the alternating electric field to be applied to the fluid so as to cause the continuation to form when the break is formed, that is while, or during a time in which the break exists. As noted above, the conditions for DEP assembly in the break may be thought of as automatically being provided as soon as the break is formed, by virtue of the creation of a region, between the two broken ends, in which an inhomogeneous electric field suitable for DEP assembly of dispersed nanoparticles in that region is applied by the broken ends, which act as continuations of the first and second electrodes. Thus typically the electric field is applied to a region or volume of the fluid between or proximal to the first and second broken ends.

The continuation that is formed by the assembly of the plurality of nanoparticles in the fluid between the two broken ends might not, in some instances of a break being formed, be wider than the initial narrow section. Should the continuation be narrower or as narrow as the initial narrow section, the applied AC voltage will generally cause a current through that continuation that typically causes the continuation to break again, thereby initiating a further reassembly step. This may continue until a continuation of sufficient width, or width great enough to withstand the current caused by the AC voltage without being caused to break, is formed.

Typically, the applied AC voltage includes a DC bias so as to control the direction in which the growing continuation is assembled. Thus the DC bias may be configured such that a first end of the structure is formed by mobile nanoparticles within the fluid attaching to the first broken end. In other words, as with the prior art methods of dielectrophoretic assembly, a DC bias may be used to control the electrode, or in the presently disclosed method the effective extension thereof in the form of the broken end of the structure, upon which the continuation begins to form, and also therefore the direction of growth or assembly.

In some embodiments, the method further comprises monitoring the current passing through the continuation of the elongate structure and continuing to apply the AC voltage across the portion of the elongate structure at least until the monitored current is equal to or greater than a target current. Since, as noted above, a continuation that is formed in a break in the elongate structure may not necessarily have a sufficiently large width to withstand the current caused by the applied AC voltage when the circuit is once again completed by the formation of the continuation, a number of repeating breaking and reassembling cycles may occur during the time that the AC voltage is applied across the portion. Because of this, it is beneficial in some embodiments to allow these burnout cycles to continue until a continuation is formed that has a sufficiently high width, cross-sectional area, or a sufficiently low resistance to be able to withstand a current having a particular value.

In some embodiments, monitoring the current passing through the continuation of the elongate structure comprises monitoring the AC amplitude of that current. Thus the method may comprise continuing to apply the AC voltage across the portion of the elongate structure at least until the monitored current amplitude is equal to or greater than a target current amplitude. The amplitude of the AC current may be monitored by way of monitoring an instantaneous current value, or an average current value for a period of time, and estimating the amplitude of the AC current in accordance with the monitored value. In such embodiments it may not be necessary to explicitly estimate or calculate the current amplitude. In these cases the monitored value may instead be used as an implicit indication of the current amplitude, and the method may be performed based upon the monitored value. For example, the applied AC voltage may be applied or varied in accordance with the monitored current value, without explicitly calculating a value for the current amplitude.

Typically, the current is monitored by obtaining an average value for the current taken across a period of time, which may be thought of as a monitoring window. The duration of the monitoring window may be a parameter than can be modified or optimised. Optimising this parameter may comprise selecting a duration that is sufficiently short to allow reactive or corrective adjustments to the applied AC voltage to be made sufficiently rapidly, and is sufficiently long to provide a sufficiently accurate estimate of the AC current parameters.

The AC signal applied to the portion of the structure typically also includes a DC bias. Therefore, the monitored instantaneous or average value of the current at a given time typically corresponds to the value, for that time, of a superposition of the periodic, AC signal and the DC bias. The parameters of the AC current, such as the amplitude and DC bias, may be estimated in accordance with one or more monitored current values.

The target current amplitude may correspond to the minimum amplitude that is required or desired for the elongate structure or the portion thereof, for a given applied AC voltage. In this way, it can be ensured that the modification process continues until one or more burnout cycles result in the electrical resistance of the portion being reduced to a particular value, corresponding to the target current amplitude and applied AC voltage amplitude.

In some embodiments, the method further comprises varying the AC voltage that is applied in accordance with the monitored current, or the monitored current amplitude. It is found to be beneficial to the controllability of the method to modulate the electrical signal that forms the line and leads to line tempering and sintering. By applying process parameters that are dynamic, rather than static, such as by varying the applied voltage amplitude in accordance with the monitored current through the portion, the applied voltage can be controlled in such a way that the modification process is optimised by being made more efficient and by reducing the risk of damage to the structure which may not be repairable by DEP. Typically, this varying of the applied AC voltage comprises varying the amplitude of the applied AC voltage. Thereby the maximum difference of the alternating electric current from the average current value that is caused to flow in the portion by the applied alternating electric potential may be controlled by controlling the maximum difference of the alternating electric potential from the average potential value. In embodiments wherein the applied AC voltage comprises a DC bias, the varying of the applied AC voltage may comprise varying the DC bias of the applied voltage. In different embodiments one or both of the amplitude and the DC bias of the applied AC voltage may be varied in accordance with the monitored current.

In some embodiments, the applied AC voltage is varied in accordance with a relationship between the monitored amplitude of the current, or the monitored current, and a predetermined tempering current. The tempering current may be configured or predetermined with a value corresponding to a current value or amplitude that is desired for the line or line portion to be able to endure without breaking at a given applied AC voltage level. The aforementioned relationship may, for example, be the difference between the monitored current and the tempering current, or it may be a ratio of the two, or it may be some other mathematical relationship. Typically, the variation in applied AC voltage is configured such that, for example, when the monitored current is greater than the tempering current, the applied voltage is reduced, and vice versa.

In some embodiments, the variation in the applied voltage may be configured to be linked directly or indirectly to the monitored current amplitude, or the monitored current. Thus in some embodiments the applied AC voltage, in particular the amplitude thereof, is varied according to a feedback loop using the monitored current, or amplitude of the current, as feedback data. In this way, changes in the flowing current that may be caused by changes in the applied voltage are monitored and used by a system or apparatus implementing a method to reactively vary the applied voltage. This may be configured such that the feedback loop correctively varies the applied voltage so as to adjust the current towards a desired or predetermined value. This may be the target tempering current. It has been found that basing the modulation of the electrical signal upon a feedback loop between a current measurement system, a voltage generator, and a printing head for forming the structures, results in an advantageously controllable line growth and modification process.

It will be understood that the application and adjustment of the voltage signal may be implemented in a number of different ways. In some preferred embodiments, the applied voltage may be changed or modulated using a digital circuit. However, it is also envisaged the applied voltage signal may be altered using an analogue circuit, for example.

In some embodiments, the narrow section is one of a plurality of narrow sections included in the elongate structure, and the AC voltage is applied in such embodiments so as to cause the break in the elongate structure to be formed at the most narrow of the plurality of narrow sections. It will be understood, therefore, that the method may be used to repair or modify a section or a portion of elongate line structure that contains or includes several bottlenecks, that is sections with a smaller width, cross-sectional area, or conductance than the average or maximum value for the line.

Typically this involves, when a continuation is formed so as to repair the break, whereupon the continuation is less narrow and has lower resistance than another of the plurality of narrow sections, the higher current that is then enabled to pass through the structure or portion thereof by the now thicker modified section or continuation then causing that other of the plurality of narrow sections to be disrupted. This might be caused, for example, by the greater degree of Joule heating that is allowed to flow in the second narrow section following the removal of the limitation upon the flowing current caused by the initial narrow section. Thus that other section, that is the second narrow section which is rendered, by virtue of the first repair incidence, the most narrow section in the portion, may be broken, and subsequently re-joined or repaired by a further continuation. These cycles may continue until all of the plurality of narrow sections in a portion of an elongate structure have been modified so as to bring the overall resistance of the portion to a level at which target tempering current may be endured by the portion, for example.

In some embodiments of the method, for example where multiple burnout-repair cycles are caused to occur during the modification process, the method may further comprise, if the formed continuation is as narrow or narrower than a target width corresponding to a width for which a section of the elongate structure will be caused to break, continuing to apply the AC voltage so as to: cause an alternating electrical current to pass through the continuation such that a further break in the elongate structure is formed at the continuation, the break being defined between a first further broken end and a second further broken end of the elongate structure, and then cause, when the further break is formed, an alternating electric field to be applied to the fluid such that a plurality of the nanoparticles contained in the fluid are assembled to form a further continuation of the elongate structure extending from the first further broken end towards the second further broken end so as to join the first further broken end and second further broken end. The formed continuation being as narrow as or narrower than the target width may also correspond to the formed continuation having a cross-sectional area or diameter as small as or smaller than a target value. This can be defined by the narrowness at a given point or the narrowness along a particular length, that is along the length of a particular narrow section or narrow part of a continuation.

The width for which a section of the elongate structure will be caused to break may also be considered as being a particular morphology for which a section of the structure will cause to break, for instance a tapering or hourglass shaped bottleneck morphology may also exist in a continuation, and may cause that section or a narrow point or section thereof to break when a current passes through it. The AC voltage that is continued to be applied is typically of the same AC amplitude, or if the amplitude is varied, it is typically configured with the same voltage variation parameters as the voltage or voltage parameters with which the initially applied AC voltage was configured.

According to these embodiments, a cycle of breaking and reassembly of the narrow section is caused to occur and repeat until a further continuation is formed that has a width greater than the target width.

Although the method may be used to modify a portion of an elongate structure so as to increase the minimum width, thickness, diameter, or cross-sectional area at any point along that structure up to a minimum threshold corresponding to the minimum conductance that allows the structure to endure the target or tempering current, it is in some embodiments advantageous to perform the method in stages so as to incrementally increase the target current amplitude. Therefore, in some embodiments, the steps of: applying an AC voltage across a portion of the elongate structure that includes a narrow section, monitoring the AC amplitude of the current passing through the continuation of the elongate structure, and continuing to apply the AC voltage across a portion of the elongate structure at least until the monitored current amplitude is equal to or greater than a target current amplitude, may define, or be thought of as defining one modifying cycle. Thus the method may further comprise performing one or more further modifying cycles, for each of which each of the amplitude of the applied AC voltage and the target current amplitude is increased with respect to the previously performed modifying cycle. By staging the increase of the target current amplitude towards the ultimate or final desired target current amplitude, rather than immediately applying the AC voltage so as to attempt to reach it at the start of the process, the risk of damaging the elongate structure by way of the too sudden application of too higher current is mitigated.

Performing multiple modification cycles, or tempering cycles, in this way allows the current that runs through the structure to increase with each cycle. This may then cause the failure or breakdown of the structure material in successively thicker, wider, or more conductive narrow sections. Each progressively wider narrow section to be broken may be at a different part of the structure from a previously broken narrow section in a previous cycle, or may be or correspond to the same section of the structure. That is, successive cycles may cause a section broken and repaired in a prior cycle to be broken and repaired again. Equally a later cycle may cause a new, hitherto unbroken section to be broken and repaired.

In a given modification cycle, once the structure or the portion is sufficiently robust to carry the target current for that cycle, that is once the resistance limited by the most resistive section of the portion has been reduced to a level where the applied voltage results in the target current for that cycle without burnouts or breakages or line failures occurring, the subsequent cycle may be started. Each subsequent cycle may have an increased applied voltage in order to reach an increased target of the tempering current.

The modification process may itself be part of a combined printing or formation and modification process. It may be possible to form a line by way of dielectrophoresis, for example, using a print head according to the above discussed prior art, and then stop the print head for example so as to allow the assembling elongate structure to grow sufficiently far to reach and make contact with a second electrode and thereby complete an electrical circuit and allow a current to flow through the structure, initiating the modification process. Thus, in some embodiments, the providing of the elongate structure formed upon the substrate and the fluid deposited upon the substrate comprises: depositing the fluid on to the substrate so as to define a wetted region; and applying an alternating electric field to the fluid on the region, using a first electrode and a second electrode, so that the plurality of the nanoparticles are assembled to form the elongate structure, extending from the first electrode towards the second electrode; and further comprises, during the step of applying the alternating electric field, increasing the separation between the first and second electrodes by moving the second electrode away from the first electrode so as to extend further the elongate structure towards to the second electrode.

The line formation step is typically a separate stage from the line modification process. However, as noted above, both of the line formation and the line modification may be performed with the same pair of electrodes. However, in various embodiments, either or both of the first and second electrode used in the providing of the elongate structure may be different from or the same as the respective first and second electrodes used in the line modification process. However, it is preferable to use the same first and second electrodes for both formation and repair.

Thus the method can provide a way of both forming or assembling an elongate structure upon a substrate using dielectrophoresis and modifying that structure so as to ensure it contains no bottlenecks.

In some embodiments, that may be thought of as involving a combined formation and modification process, the elongate structure may be formed in segments, one segment at a time, rather than printing the entire length of the elongate structure in one movement, or one continuous pass of the moving electrode. In some embodiments therefore, the method may comprise providing and modifying a respective elongate structure upon each of a plurality of adjacent regions on the substrate, such that each structure is connected to at least one other structure. In this way, a long line may be provided and modified in segments, with the line being built up segment-by-segment, with each segment being modified so as to improve its robustness after it has formed but before moving on to the next segment.

It may be advantageous to set a condition or a criterion, in such step-by-step assembly modification processes, to control when a modification stage for each segment is complete, or defined as being sufficiently complete. Therefore, in some embodiments the method comprises forming and modifying each of the plurality of elongate structures in sequence, wherein the modifying of each elongate structure is continued until a completion criterion until the respective elongate structure is fulfilled.

When a line is built segment-by-segment, certain conditions related to the quality, robustness, conductance, or uniformity of width or any of these properties may need to be fulfilled before a printing head being used to form the line segments can move and begin building the next segment.

These conditions or criteria may involve the AC current amplitude through the elongate structure. In particular, such embodiments typically include monitoring the AC amplitude of the current passing through the continuation of the elongate structure, wherein the completion criterion comprises one or both of: the monitored current amplitude being equal to or greater than a predetermined completion target current amplitude for at least a predetermined duration, and a monitored resistance of the respective elongate structure being less than or equal to a predetermined completion resistance. By defining these completion thresholds based upon either or both of the current amplitude or structure electrical resistance for example, it may be shown that modification of each segment continues until the quality of that segment, as measured by factors such as resistance and current that the structure is able to endure, has reached a minimum threshold, and in some embodiments has sustained that threshold for a predetermined minimum duration for instance.

In some of these embodiments, if the completion criterion for a respective elongate structure is not met during a predetermined duration, the method may comprise repeating the forming and modifying of that structure. This may be advantageous if a line segment is formed that has a morphology or physical nature which means it is difficult or impossible for the quality or robustness threshold to be reached. In such cases, no amount of continuing to cause burnout and repair cycles to occur will result in the narrow sections present in the line to be repaired such that the quality or robustness of the line is brought up to the desired threshold. Therefore, by placing a limit on the amount of time for which the modification process is applied to a structure or segment without the current, resistance, or general quality requirement being met, and causing that section of the line to be reassembled by starting the DEP formation process for that segment all over again, the efficiency of the formation and modification procedure is improved.

In accordance with the invention there is also provided an assembly comprising a substrate having an elongate structure formed upon it, obtained by the method of the present disclosure, the structure having a width less than 1 µm and a length greater than 100 µm, wherein the width of the structure at its most narrow point is greater than or equal to 70% of the average width of the structure. The presently disclosed modification method allows elongate structures having novel characteristics to be produced. In particular, whereas the line assembly DEP techniques of the prior art made possible the formation of ultra-fine lines with sub-micrometre widths and lengths of the order of several centimetres, the methods of the prior art could not produce elongate structures having the width uniformity that the above disclosed modification process can provide. The method according to the first aspect may be used to modify structures of different lengths, and the structure of the assembly according to the second aspect may, in various embodiments, have a length greater than 1 mm, 10 mm, 100 mm, or 1 cm. The combination of moving-electrode DEP structure assembly and structure modification according to the present invention advantageously permits the creation of elongate structures that are both ultra-narrow and long, as well as uniform in terms of their width, or lack of bottlenecks.

Dielectrophoretic assembly, and subsequent modification according to this disclosure can produce, in addition to lines having widths or average or maximum widths less than 1 µm, lines more narrow than 900 nm, 800 nm, 700 nm, 600 nm, 500 nm, and even 250 nm and narrower. Likewise, although a line length of 1 cm is given as an example, the dielectrophoretic assembly process that uses a moving electrode can produce lines of arbitrary length, as desired for the given application, and so may be more than 5 mm, 2 cm, 5 cm, or 10 cm in length.

The width of the structure as referred to here at its most narrow point could be defined according to the linear width, that is the diameter, or the smallest diameter, at any point and measured in any orientation perpendicular to the length of elongate axis at the point of measurement. The width could also refer to the cross-sectional area perpendicular to the length or elongate axis. It will be understood that, in general, the width of the structure at its most narrow point being greater than or equal to 70% of the average width of the structure, when width is defined as linear width, corresponds to a minimum narrow width of 49% of the average width of the structure when width is defined as cross-sectional area.

Preferably, the linear width at the most narrow point is at least 80%, more preferably at least 90%, of the average linear width, which corresponds to 64% and 81% of the width in terms of cross-sectional area, respectively. The average width is typically defined as the mean width along the length of the structure or along the length of the portion thereof.

In accordance with the invention there is also provided an apparatus for modifying an elongate structure upon a substrate, the apparatus comprising: a first electrode and a second electrode for applying an AC voltage across a portion of the elongate structure containing a narrow section to be modified when the first electrode is in contact with the elongate structure at a first end of the portion and the second electrode is in contact with the elongate structure at a second end of the portion, the apparatus being configured to apply the AC voltage so as to: cause an alternating electric current to pass through the narrow section such that a break in the elongate structure is formed at the narrow section, the break being defined between a first broken end and a second broken end of the elongate structure, and then cause, when the break is formed, an alternating electric field to be applied to the fluid such that a plurality of the nanoparticles contained in the fluid are assembled to form a continuation of the elongate structure extending from the first broken end towards the second broken end so as to join the first and second broken ends.

Advantageously, the apparatus is capable of providing structures comprising narrow lines formed from self-assembled nanoparticles upon a substrate, with those narrow lines being free from narrow sections or bottlenecks, and consequently having higher conductive quality and robustness.

The apparatus may include a printing table on which a substrate for printing may be positioned, and this printing table may comprise a heater, for example, arranged to apply heat so as to remove deposited fluid once the structure has been formed and modified. The heater may also be used to contribute to the sintering of the line, for instance by supplying additional heat and controlling the temperature of the structure and the narrow section thereof.

In some embodiments, the apparatus further comprises a current monitor, or some device that allows electrical current may be indicated, monitored, measured, or quantified, the current monitor being configured to monitor the AC amplitude of the current passing through the continuation of the elongate structure, and the apparatus being configured to continue applying the AC voltage across the portion of the elongate structure at least until the monitored current amplitude is equal to or greater than a target current amplitude. In this way, the apparatus may be configured to, for example by way of an electrical signal controller and computer processor configured with appropriate executable instructions, to continue applying the AC voltage through however many burnout-repair cycles are needed in order to sufficiently repair the one or more narrow sections of a given elongate structure in order to allow the target current amplitude to be reached for the given voltage.

The current monitor typically comprises an electrical resistor connected, or suitable for being, or configured to be, connected in series with the narrow section of the elongate structure, and a potential difference monitor configured to monitor the potential difference across the electrical resistor so as to monitor the current passing through the narrow section. The electrical series connection, i.e. an electrical circuit connection or components arranged so that current passes through each component successively, means that the current passing through the resistor is the same as that passing through the portion of the elongate structure, and in particular the narrow section thereof. Therefore, by using the potential difference monitor, for example, a voltmeter, to measure the voltage across the resistor, the current through the portion and the narrow section may be measured.

In some embodiments, the second electrode is movable with respect to the first electrode. Thus it is possible to use the movable second electrode to form an extended elongate structure starting from the first electrode, and to use the electrodes to modify the formed structure so as to remove bottlenecks from it. The first electrode may preferably be stationary, or in a fixed position with respect to the substrate, at the starting point along the elongate structure path on the substrate. In this way, the entire length of an elongate structure may be printed in one movement, or one continuous pass of the moving electrode.

Alternatively, or additionally, each of the first and second electrodes may be moveable with respect to the substrate. An apparatus with such a configuration could be used to form and modify an elongate structure in segments, one segment at a time, in contrast to the continuous approach described above. In such embodiments, the apparatus may be used to provide and modify a respective elongate structure upon each of a plurality of adjacent regions on the substrate, such that each structure is connected to at least one other structure. In this way, a long line may be provided and modified in segments by the apparatus, with the line being built up segment-by-segment, with each segment being modified so as to improve its robustness after it has formed but before moving on to the next segment, as described above, in connection with the first aspect.

In some embodiments, each of the first electrodes may be immovable with respect to the substrate. Thus the position of the electrodes may be fixed relative to the substrate, in particular when the apparatus is in use. In this way an apparatus that is simpler in its construction and use, compared with embodiments wherein one or both of the electrodes are moveable, may be provided.

An apparatus may, in some embodiments, be suitable for providing and modifying an elongate structure upon the substrate. Such an apparatus may further comprise a print head for depositing fluid containing electrically polarizable nanoparticles onto a substrate, wherein the first electrode and the second electrode are suitable for applying an alternating electric field to a wetted region defined by the fluid deposited by the print head when each of the first and second electrodes is in contact with the elongate structure, or in some embodiments when each of the first and second electrodes is in contact with the elongate structure or is in contact with the fluid, wherein the second electrode is movable with respect to the first electrode. Such a device may be capable of creating thin, elongate structures using dielectrophoretic assembly by way of moving a second electrode, and then these structures may be modified using the same apparatus, so as to increase the robustness of the structures. The electrodes may be shaped and/or configured such that they are suitable for applying a dielectrophoresis-inducing electric field in the region fluid wherein the assembly and/or modification of the elongate structure is occurring at a given time. One or both of the first and second electrodes are typically suitable for applying the electric field while in contact with the structure or the fluid.

Typically, during modification of an assembled elongate structure, both of the first and second electrodes are in contact with the structure. However, it is envisaged that a suitable electric field may be applied to the fluid surrounding or proximal to the narrow section to be modified so as to cause the breaking of the narrow section and/or the formation of the continuation of the elongate structure by positioning one or both of the electrodes proximal to the narrow section, with or without the one or both electrodes being in contact with the structure itself. Typically, during this, both electrodes are in contact with the volume of fluid containing the narrow section.

Typically, at least one of the electrodes has an elongate shape comprising a pointed end, and preferably each of the first and second electrodes is so shaped. A pointed end may be defined as a tapered tip or end portion shaped so as to create a local electric field strength at the tip greater than that present when a non- or less pointed electrode is used.

Such morphology may result in a more controllable growth process when initially forming the structure, since the smaller dimensions of the ends of the electrodes may allow the points with the electric field at which the structure growth begins to be more precisely defined.

Preferably, the second electrode comprises a conduit for delivering the fluid to the substrate from the print head. The second electrode having the form of an elongate needle comprising a pointed end within which a conduit opening, or a nozzle, via which fluid may be deposited, is formed, is preferred. A second, movable electrode having this form allows fluid to be deposited by the same element of the apparatus that also serves to contribute to the formation of a relatively high intensity alternating electric field suitable for dielectrophoresis.

Therefore, in some preferred embodiments, the second electrode is formed as part of the print head. Indeed, the second electrode may form the print head or the print head may be the second electrode itself.

In typical embodiments, the apparatus further comprises a mechanism for moving the second electrode, and is configured such that, when the apparatus is in use in an assembly mode, that is configured to produce elongate structures upon a substrate, the first electrode is in contact with a first end of the elongate structure being assembled and the second electrode is moved away from the first electrode so as to increase the separation between the first and second electrodes so as to further extend the elongate structure towards the second electrode. Thus, in assembly mode, the apparatus may perform dielectrophoretic assembly of elongate structures according to the prior art, prior to carrying out a modification mode for repairing or improving the quality of that line.

Typically, the apparatus is configured such that, when the apparatus is in use in a modification mode, the first electrode is in contact with a first end of an elongate structure being formed and the second electrode is in contact with a second end of the elongate structure being modified. In preferable embodiments, the first and second electrodes are suitable for both assembly and modification modes, and so can be used to initiate and complete the growth of an elongate structure, by way of applying an alternating electric field to a volume of deposited fluid, as well as contacting the formed structure, at each end of the structure or at each end or a portion thereof, so as to apply a tempering current to it.

The apparatus typically comprises a signal controller configured to control an alternating electric signal applied to the first and second electrodes so as to apply an alternating electric field between the first and second electrodes. The controller is typically configured so as to apply a voltage that causes dielectrophoretic assembly of nanoparticles in a region of fluid ink subjected to the electric field and containing mobile nanoparticles, and also producing a tempering current when the electrical circuit comprising the elongate structure portion is complete.

The signal controller may be configured such that the current caused to flow in the structure between the electrodes as a result of the applied voltage has an AC amplitude in the range 1-10,000 µA and a DC bias in the range 0.1-1000.0 µA. As noted above, such a configuration may be beneficial in some embodiments.

Typically, the apparatus further comprises a mechanism for moving the print head. This may comprise any form of conveyor or actuator by which the position of the print head or the second electrode in particular may be adjusted so as to move the print head across the substrate and thereby trace out a path along which fluid may be deposited and an elongate structure may be assembled. The mechanism may be configured to halt or slow movement of the print head or second electrode when modification mode is initiated.

Preferably, the mechanism is configured to, in assembly mode, move the print head in an XY plane substantially coplanar with the surface of the region of the substrate upon which the structures are to be formed. Preferably, the mechanism is also configured to move the print head in a Z direction substantially perpendicular to the surface of the region of the substrate upon which the structures are to be formed. In other words, the print head, or the second electrode, is movable by the mechanism in three dimensions denoted by the X, Y and Z directions. Thus the height of the moving electrode may be varied in accordance with the surface profile of the substrate so as to be able to print on non-flat or planar surfaces. Such movability in the Z axis is particularly beneficial for printing upon curved, inclined, or rough surfaces.

Typically, the quantity of ink, that is nanoparticle-containing fluid, deposited on a substrate surface at the start of assembly mode, for instance, will be low enough so that nanoparticle ink may sit or stay within the wetted region without running off or moving due to gravity. The dimensions, quantities, and fluid properties of the nanoparticle-containing ink may be selected such that the force of adhesion between ink and substrate may be stronger than any force due to gravity which might otherwise cause the fluid to move or be displaced from the wetted region. Owing to the volume of deposited ink being sufficiently low, the mass of deposited ink may also be small enough so that the weight of an ink volume is less than the forces preventing the ink from being displaced. Moreover, several parameters may be controlled so as to avoid the ink running off or moving when used in non-flat surface applications. For example, a wide variety of binders or adhesion promoters may be added to the ink in order to improve the adhesion between the ink and the substrate.

Additionally, the surface free energy of the substrate may be altered by way of chemical or plasma treatment. Plasma treatment may allow surface properties to be achieved that would help to prevent deposited ink running from the desired wetted regions, such as by increasing wettability.

Additionally, the viscosity and the surface tension may be key parameters of the fluid ink composition that may have an influence on the movement or behaviour of deposited ink upon surfaces such as inclined or curved substrates. Both of these properties are related to the surface energy which quantifies the disruption of the intermolecular bonds that occur when the surface is created. Modifying and optimising these two parameters may therefore be beneficial so as to, for example, increase the viscosity and the surface tension and thereby encourage deposited ink to remain in the deposited surface area or wetted region.

Typically, the apparatus further comprises a print controller for controlling the movement of the print head in assembly mode. This may be a computer-operated or a user-operated device for providing control signals to the aforementioned mechanism so as to move the print head or the second electrode across the substrate in accordance with the desired elongate structure pattern.

BRIEF DESCRIPTION OF THE DRAWINGS

Examples of the present invention will now be described, with reference to the accompanying drawings, in which.

DESCRIPTION OF EMBODIMENTS

Figure 1:
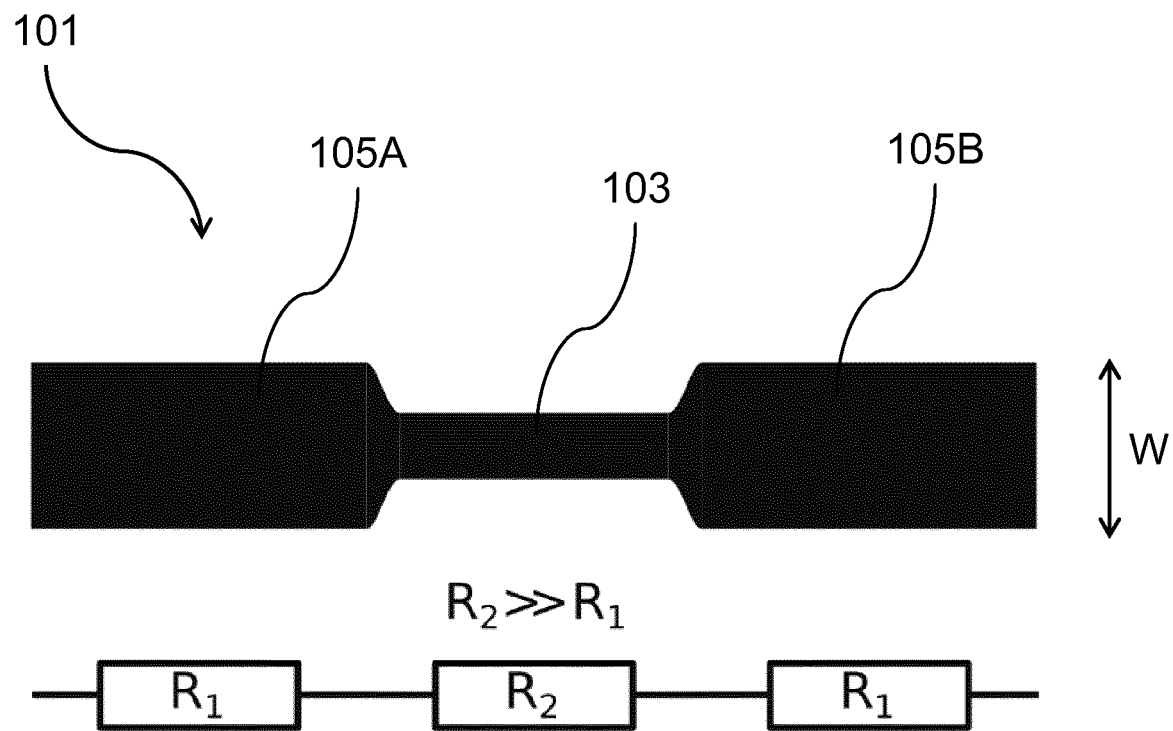
FIG. 1 is a schematic drawing of a narrow section in a conductive line.
Figure 2:
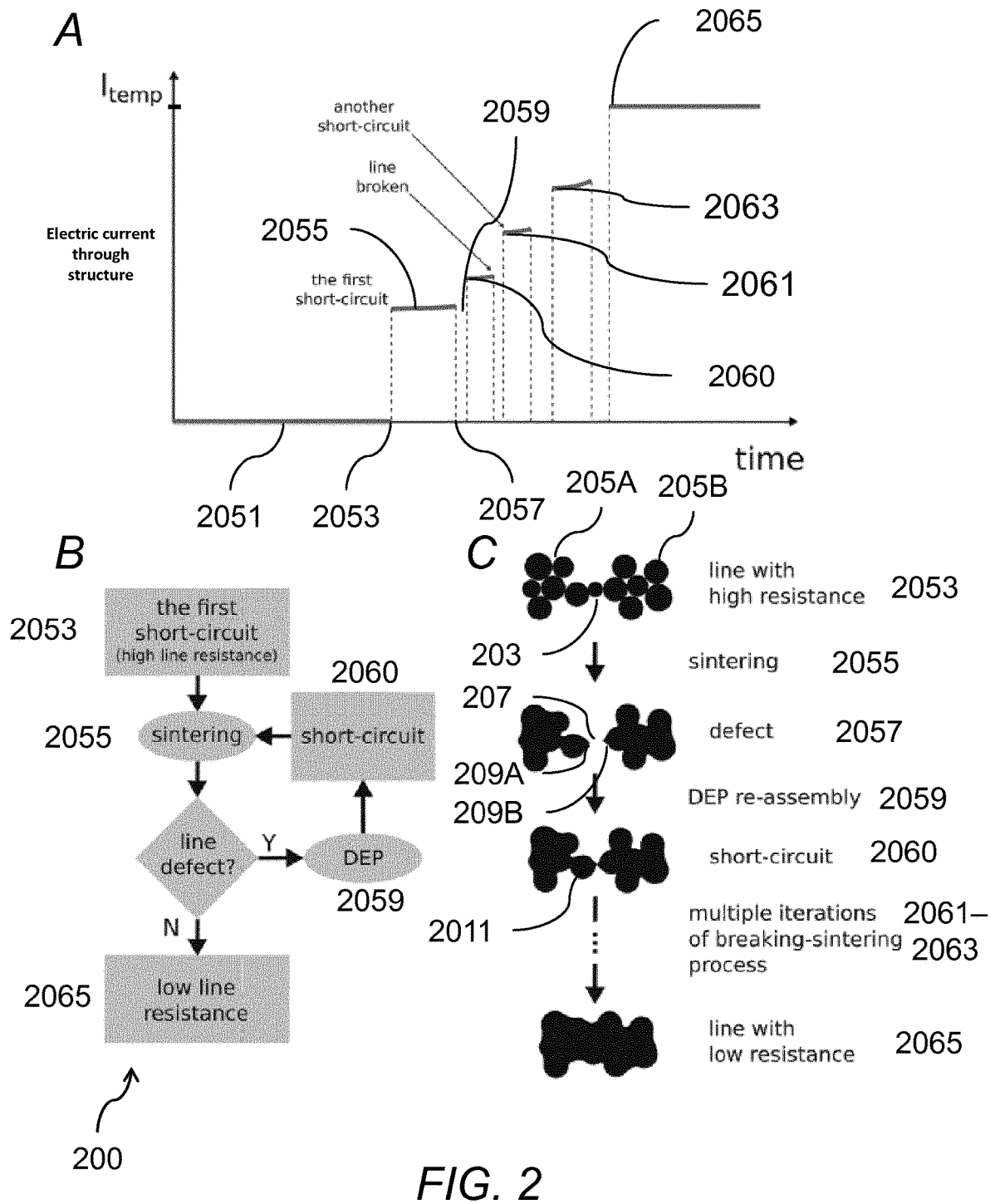
FIG. 2A is a graph plotting the electric current passing through a portion of an elongate structure over time during a first example method according to the invention.
FIG. 2B is a flow diagram illustrating steps of the first example method according to the invention.
FIG. 2C is a schematic drawing of a section of an elongate structure at several stages during the first example method according to the invention.
Figure 3:
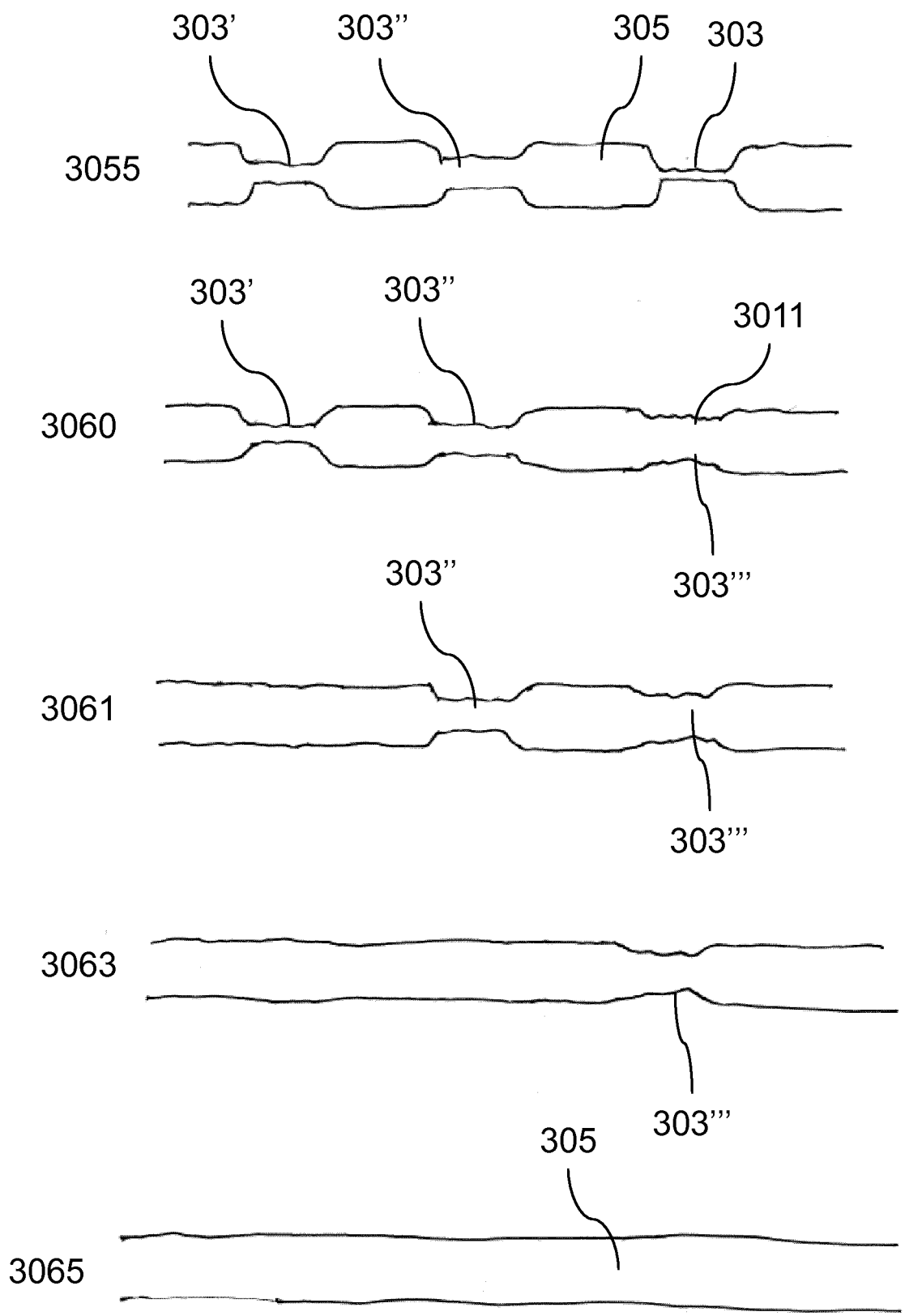
FIG. 3 is a schematic drawing of an elongate structure including multiple narrow sections.

With reference to FIGS. 1-3 a method 200 of modifying an elongate structure 101 is now described. Part of an elongate structure 101 including a narrow section or bottleneck 103 is depicted schematically in FIG. 1. For the sake of simplicity of illustration, the width of the structure W is shown as being uniform for each of the narrow section 103 and the two wider or normal sections 105A and 105B. However, in practice, owing to the previously discussed randomness involved in the nanoparticle assembly process employing dielectrophoresis, this width uniformity is unlikely to be present.

The width, thickness, diameter, or cross-sectional area perpendicular to the elongate axis of the structure 101 is considerably smaller in the narrow section 103 than in the remainder of the structure 105A, 105B, and is smaller than that of the maximum value for the structure (the average and maximum value for the remainder of the structure being the same in the present illustration owing to the schematic nature of the drawing). Width and thickness may refer to the greatest linear extent of the elongate structure in a plane parallel to the elongate axis of the structure at a given point, parallel to and normal, respectively, to the plane of the substrate upon which the structure is formed at that point. Diameter may refer to a similarly transverse, that is perpendicular to the elongate axis, measure of linear extent, at any orientation in the transverse plane, and typically corresponding to a straight line passing through the geometric centre of the cross-section in that plane. For structures with non-circular cross-sections, diameter might refer to an average diameter for all transverse orientations. The line is formed from a material that is electrically conductive. However, the electrical conducting capability of the structure is limited by the narrow section 103, because the morphology of that narrow section, namely the tapering to a width or cross-sectional area that is smaller than the remainder or average width of the structure. This is because, for a material with a given conductivity, the rate at which electric charge may be carried along a structure made of that material is dependent upon the cross-sectional area of the material at a given point perpendicular to the axis corresponding to the direction of current flow. This bottleneck in the conductor, that is this narrow section 103 that impedes the rate of flow of charge along the structure 101 is illustrated notionally by the circuit diagram section shown at the lower part of FIG. 1. The resistance $R_1$ of each of the wider or normal sections 105A and 105B is considerably lower than the resistance $R_2$ of the narrow section 103.

It should be noted that a bottleneck 103 in an elongate structure 101 such as this may still be thought of or classified as such while having a range of different lengths. For example, rather than the extended narrow section 103 depicted in FIG. 1, which has a length comparable to the wider sections 105A and 105B, a narrow section may also exist that has a shorter length, for example a narrow section in which the width or cross-sectional area of the structure tapers or is small relative to the average or maximum width or area of the structure by virtue of being formed as one or more notches coinciding at a point or section of a structure.

FIG. 2A illustrates the current flowing through the line during a modification process, which may be thought of as a tempering process, according to the first example method. FIG. 2B sets out what happens to the line of the elongate structure itself during this line tempering process. Initially, at the stage indicated at 2051, which may correspond to a time during which the line is being grown or assembled by dielectrophoresis, the current flowing through the elongate structure line is zero. This involves some fluid ink, that is fluid within which polarizable nanoparticles are dispersed, being provided upon a substrate and the elongate structure being grown from that dispersion of nanoparticles, in accordance with the previously discussed known method.

The fluid contains electrically polarizable nanoparticles in the form of silver nanoparticles having a diameter of 100 nm. The mass fraction of the nanoparticles within the fluid is 0.2%. The main component of the fluid is a solvent in the form of ethylene glycol. The fluid also contains a stabilizer in the form of glucose, which has a mass fraction within the fluid of 0.6%.

Since the fluid ink is not conductive, or is not sufficiently conductive to carry a current at the given applied voltage amplitude, and because the elongate structure is not in contact with both electrodes, the elongate structure forms part of an incomplete circuit. When the line short circuits with the second electrode, for example by stopping or slowing the moving second electrode so as to allow the growing end of the elongate structure to reach it, the current starts to flow, at point 2053. During step 2055 the elongate structure is sintered or coalesces by means of the heat generated by virtue of the current passing through the line. The current flowing through the elongate structure is in other words a source of Joule heating that sinters nanoparticles or causes them to be compressed or more closely packed, and increases the conductivity of the line by increasing the charge density that the material is capable of carrying.

A schematic illustration of a narrow section of the elongate structure, that section having high resistance relative to the remainder of the line, is shown in FIG. 2C. As this drawing shows, the sintering at stage 2055 results in a break or a line defect being formed at the narrow section at the time represented by 2057. This break or interruption in the elongate structure causes the circuit to be broken and thereby causes the current to cease flowing through the line structure.

Thus the narrow section shown in FIG. 3 at 303 is intentionally broken by way of the application of a voltage across a portion of the line containing the narrow section. The narrow section, and the comparatively wider sections either side of it 205A, 205B are also shown in FIG. 2C.

The gap or break 207 that is formed by the failure of the high-resistance section 203 during sintering results in an alternating electric field being applied to a drop or volume of fluid (not shown) that is deposited so as to envelop or contain at least the narrow section 203. In this way the conditions for dielectrophoretic self-assembly of nanoparticles dispersed within the fluid are created, specifically in the gap region 207.

The AC frequency and amplitude, and the amplitude of the DC bias of the applied electric field are such that the electric field strength and gradient present at the region 207 between the broken ends 209A, 209B results in the polarizable nanoparticles dispersed in the fluid experiencing a dielectrophoretic force which causes them to begin to assemble together upon the first broken end 209A. In the present example, the voltage applied across the electrodes starts with an AC frequency of 10 kHz, an AC amplitude of 70 V and a DC bias of 1.5 V. The inhomogeneous electric field is conducive to assembly via dielectrophoresis, not least because of the gradient or divergence of the electric field towards the electrodes generating the field. The tapering shape of the broken ends, which effectively act as electrodes, is in part responsible for producing such an inhomogeneous electric field.

The potential applied to the electrodes is additionally configured to have a DC bias which results in nanoparticles assembling by preference upon one of the two ends, which in this case is the first end 209A.

Thus at stage 2059, a plurality of nanoparticles are assembled to form a continuation 2011 of the elongate structure 201 extending from the first end 209A towards the second end 209B. This plurality of nanoparticles corresponds to those particles within the fluid that are sufficiently close to the region of assembly, wherein the electric field conditions are beneficial for assembling the particles via dielectrophoresis, in that they are attracted to and agglomerate upon end 209A so as to begin forming the continuation 2011.

Owing to the direction of the electric field between the electrodes, as the continuation 2011 grows via the progressive addition to the structure of particles within the fluid, the assembling continuation grows or extends towards the second end 209B.

When the continuation 2011 grows sufficiently far so as to reach or make electrical contact with the second broken end 209B, the circuit is again completed. This is shown at step 2060, as indicated by the reestablishment of a non-zero current flowing through the portion of the structure 201.

As indicated by FIG. 2A, the current flowing at step 2060 is greater than the current flowing at stage 2053 prior to the breaking of the initial narrow section 203. This is a result of the continuation 2011 being less narrow, and consequently having a lower electrical resistance, than the initial narrow section 203. The amplitude of the current produced by the applied AC voltage is therefore less limited following the dielectrophoretic self-repair, and is therefore greater.

The return of the current flowing in the elongate structure causes the sintering process to resume, owing to the resistive heating generated in the line. However, in those parts of the line 205 having a thickness and/or conductance greater than the desired level, the sintering will have no disruptive impact upon the assembled nanoparticles therein.

It is not certain that, following dielectrophoretic self-repair 2059, the newly built part of the line 2011 will be stronger than the initial bottleneck 203 on every occasion, since as noted earlier in this disclosure, there is a degree of randomness in the DEP assembly process. However, it will be understood that, should the newly formed continuation section 2011 be as weak or weaker than, or at least as resistive as, or equivalently at least as narrow as, the initial bottleneck 203, the current that flows through the too-narrow new section will cause that section to break as it did the initial bottleneck. These cycles will continue, with overly narrow newly formed sections being burned out and repaired again, until such a time as the newly built section is more robust, or less resistive, than the initial bottleneck 203. This cycle of burning out and repairing is so rapid that it does not significantly impact the time of the modifying process.

The graph shown at FIG. 2A can correspond to the occurrence of several iterations of the breaking-sintering process cycle, at stages 2061-2063. The incremental increases in the current re-established after the self-repair of the narrow section at each of these stages is a result of the assembly of progressively stronger or less resistive continuation sections.

Once a line is modified so as to have sufficiently low resistance along the entire length of the portion to which the AC voltage is applied such that no further breaks are formed, at point 2065, the completion target current indicated by $I_{temp}$, has been reached. This target current corresponds to the amplitude of the current through the line that is produced by a given applied AC voltage amplitude for a line or elongate structure 201 the overall resistance of which, or equivalently the overall robustness or thickness of which, is at least as great as a desired threshold.

The various stages depicted at FIG. 2A may also correspond to the repair of multiple sections that are included in a length of elongate structure and are narrower than the average, maximum, or desired thickness for the line or the remainder of the line, or a portion thereof.

Such a line is depicted at several stages corresponding to those illustrated in FIG. 2A in FIG. 3. In these figures, like reference numerals represent corresponding stages. At stage 3055 the portion of the elongate structure 301 shown contains three narrow sections 303, 303', 303", listed in order of increasing thickness. At stage 3055 an AC voltage modulated so as to cause the portion of the line to be repaired or modified is applied across the portion. Thus the sintering process is initiated, and the most narrow section 303, which has the greatest level of resistance and therefore experiences the greatest level of disruption owing to resistive heating and/or disruptive capacitance, is caused to break. Since the narrowest of the narrow sections, 303, has the greatest tendency to be broken when sintered compared with the other narrow sections, section 303 breaks first, and so causes the circuit to be broken and the current to stop flowing, thereby preventing the other sections 303', 303" from being broken at the same moment.

The DEP action is then caused to occur, such that electrically polarizable nanoparticles in fluid ink surrounding the narrow section are assembled to form continuation 3011, thereby re-joining the two broken ends and re-completing the circuit. In this illustrative example, the re-formed section 3011 remains narrower than the desired thickness for which the applied AC voltage is configured to cause the self-repairing line to reach. This first rebuilt section may be thought of as a further narrow section, 303". This stage is depicted at 3060, during which a current is again flowing in the line through each of the now present narrow sections 303', 303", and 303", which are listed in order of increasing thickness.

The sintering caused by the current flowing during stage 3060 causes the most narrow of the narrow sections present at this stage, section 303', to be broken. When that broken section is self-repaired, the current again begins to flow, at stage 3061. As indicated by the increased current shown at equivalent stage 2061 in FIG. 2A, the section with the highest resistance, is, at stage 3061, section 303", and so the current flowing through the line portion is greater still than that flowing at stage 3060.

A further cycle of sintering and reassembly occurs between the stages depicted at 3061 and 3063, such that narrow section 303" has been replaced by a continuation having similar thickness to the remainder of the line, or to the average thickness of the line. Therefore at stage 3063 the only remaining section that is narrower than the remainder of the line, and is therefore limiting upon the current that a line may conduct for a given applied AC voltage, is the initially repaired section 303'''. In the present example, the applied AC voltage is modulated so as to cause any section of the elongate structure having a thickness less than that of the normal section 305 to experience a disruptively high magnitude of current and consequently be broken. Therefore, the sintering at stage 3063, indicated by the level of current shown at equivalent stage 2063, causes the now limiting narrow section 303''' to be broken and then reformed as a continuation 3011', the thickness of which is equivalent to that of wide section 305. Thus, the target current has been reached by the progressive repair of increasingly wide bottlenecks in the portion of the elongate structure. At stage 3065, no section of the portion to which the AC voltage is applied is sufficiently narrow so as to be resistively heated to such a degree that it is disrupted or broken. Therefore, the portion is sufficiently robust, following the cycles of sintering and self-repair, to sustain the target current.

At the end of this process, which may be thought of as a modification cycle, or a tempering cycle, the current is stabilised at the level of the target current. In practice, owing to the sintering that occurs because of the flow of the target current following stage 3065, the resistivity of the line is likely to decrease further, as the assembled nanoparticles therein are caused to coalesce.

The tempering process, or the modification process, can be performed in a number of tempering or modification cycles, with each cycle having its own set or predetermined target current. A second example method according to the invention, comprising several of these modifying cycles, is depicted by way of a graph plotting current versus time in FIG. 4. The graph shows the variation current over four modification cycles, 470, 472, 474, and 476. These four cycles are listed in order of increasing target current amplitude, indicated by $I_{temp}^{(1)}$, $I_{temp}^{(2)}$, $I_{temp}^{(3)}$, and $I_{temp}^{(4)}$. In the present example, these four current values are 0.5, 1.0, 1.5, and 2.0 mA, respectively.

The first tempering cycle 470 is equivalent to the process depicted for the previously described example, shown at FIG. 2A. At the end of the cycle 470, the current flowing through the line portion is $I_{temp}^{(1)}$, which is the target current for the first cycle, indicating that a sufficient degree of self-repairing has occurred in the narrow sections initially present in the line for the structure or the portion thereof to be able to sustain a current caused by the voltage applied during the cycle 470 without any further breakages being caused by the sintering. In the present example, the duration of the first tempering cycle 470 is 7.5 ms. Likewise, the subsequent cycles 472, 474, and 476 are each 7.5 ms in duration.

The second cycle 472 is then begun by way of increasing the applied AC voltage to a level or magnitude corresponding to a higher target current than that configured for the first cycle. Because of the now-increased applied AC voltage, a greater AC current amplitude is produced in the line, which causes progressive breaks to be caused in narrow sections of the line that were not sufficiently narrow to be caused to break by the voltage applied during the previous cycle 470. In this way, the robustness of the line is increased by the breaking and self-repair processes that are caused to occur during the second cycle 472 to a degree beyond that achievable during the first cycle 470.

Figure 4:
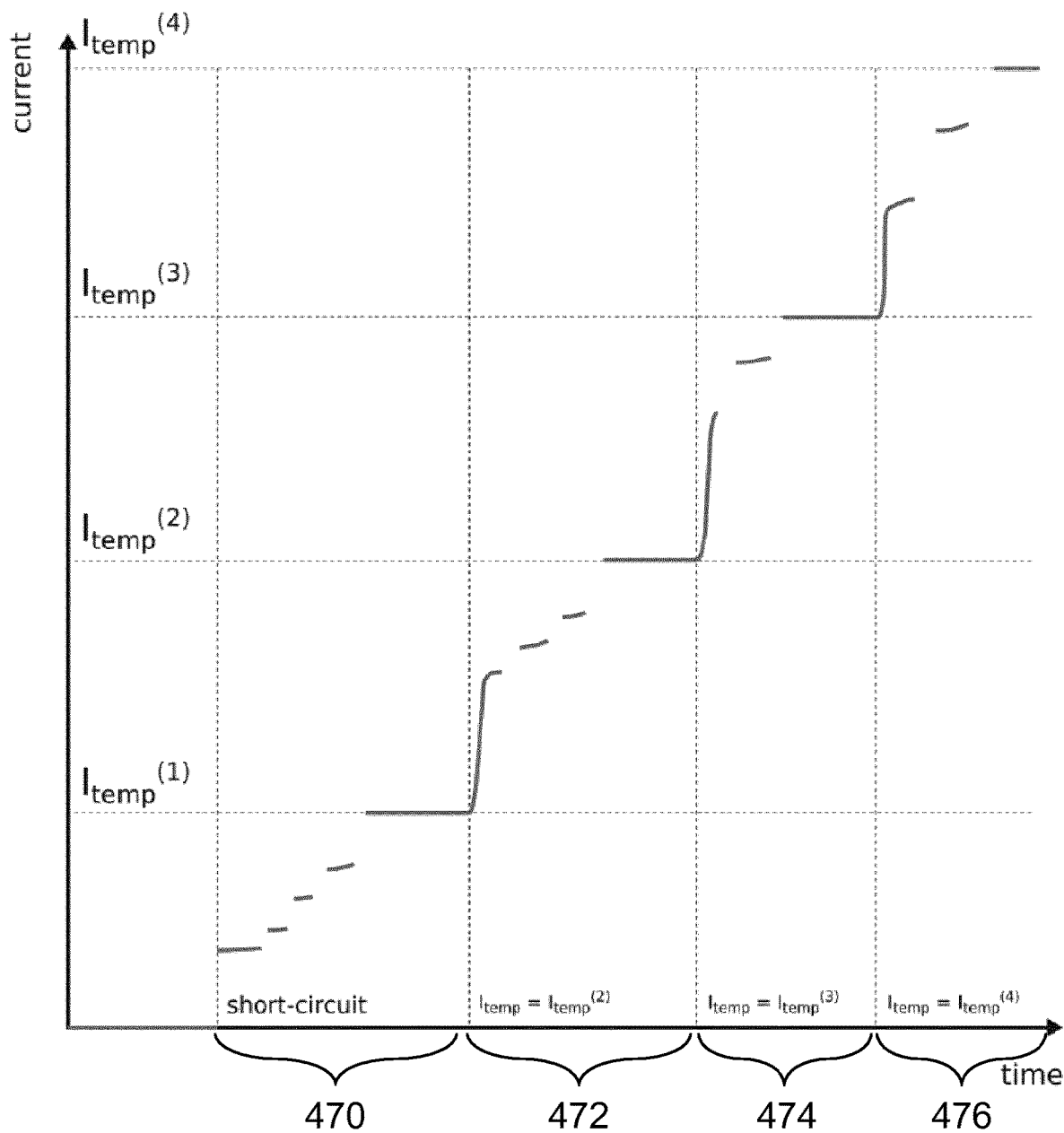
FIG. 4 is a graph plotting the electric current passing through a portion of an elongate structure over time during a second example method according to the invention.

Once the target current $I_{temp}^{(2)}$ of the second cycle 472 is reached, a third cycle 474 is begun by again increasing the applied AC voltage magnitude. As can be seen in FIG. 4, in the present example two further breakages and rebuilding steps are caused to occur during the third tempering cycle 474. This indicates that at least one narrow section was present in the line being modified at the beginning of the cycle 474 that was sufficiently robust not to have been caused to break by either of the two preceding cycles 470, 472, but which was caused to be broken by the higher voltage amplitude applied during the third cycle 474.

The fourth depicted cycle 476 involves again increasing the applied AC voltage so as to cause narrow sections that are more robust still, which may be in the same locations or different locations as those which were repaired in preceding cycles, to be broken and repaired by dielectrophoresis.

The second example method is advantageous in its inclusion of several modification cycles 470-476 for a number of reasons. Firstly, the elongate structure is caused to be more robust at the end of the tempering process by way of the higher ultimate target current than that of the first described example.

This is achieved in a faster and more controllable way than attempting to repair the line according to the current $I_{temp}^{(4)}$. Moreover, by progressively increasing the target current, and correspondingly increasing the applied AC voltage through several tempering cycles, the risk of the line experiencing a physical shock resulting from an abrupt change of temper current is reduced or avoided.

Figure 5:
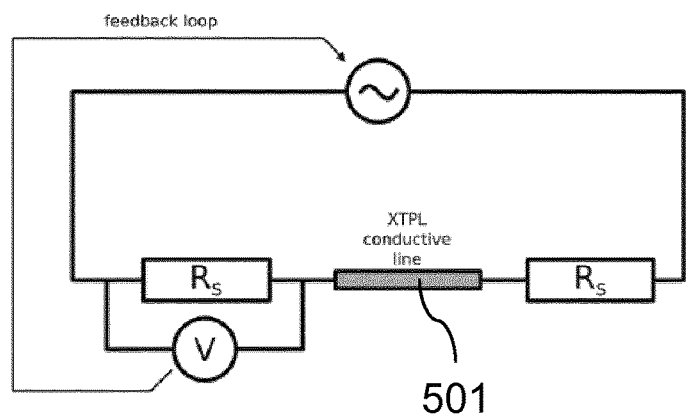
FIG. 5A is a circuit diagram showing apparatus used in a third example method according to the invention.
FIG. 5B is a graph plotting the configured variation in applied AC voltage amplitude against monitored variation in current passing through a portion of elongate structure during the third example method according to the invention.
FIG. 5C shows the variation in voltage and current over time as monitored during the third example method according to the invention.
Figure 5:
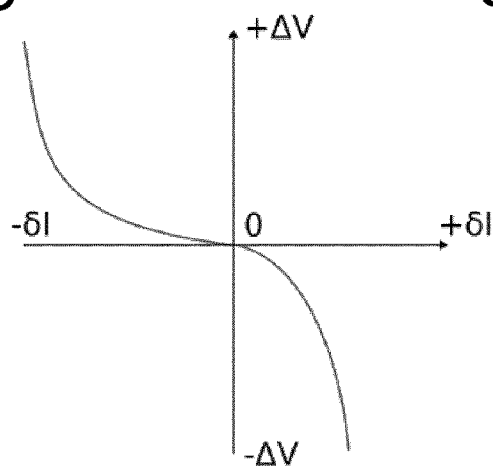
Figure 5:
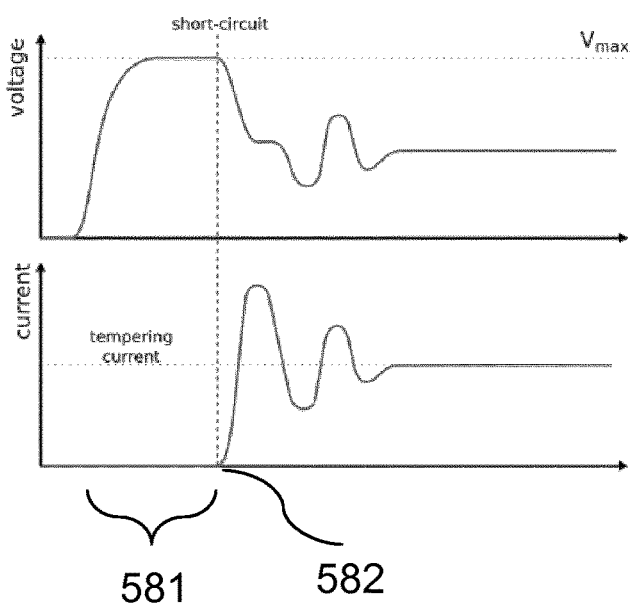

A third example method according to the invention is now described, with reference to FIG. 5. This example involves the use of a feedback loop involving current measurement, the voltage generator used to apply the AC voltage to the line portion, and a printing head for applying an elongate structure to a surface. In order to perform line tempering and assemble an elongate structure, for example, segment by segment, a feedback loop is implemented as illustrated by the circuit diagram at FIG. 5A and the graphs at FIGS. 5B and 5C. The feedback loop works as follows. Resistors $R_s$ are connected in series with the conductive elongate line structure 501. The resistance of these can be varied. Using a voltmeter, V, the voltage drop across one of the resistors is measured, which indicates the current flowing through the resistor. Since the resistors are connected in electrical series with the line 501, the current flowing through the resistors and the line is the same. Based upon the measured or calculated current, the system modifies the value of the amplitude of the generated AC voltage.

A nominal current value is set as a starting parameter. The degree to which the feedback loop system decreases or increases the applied voltage, that is ΔV, depends upon the difference between the measured current and the nominal current value, as shown in FIG. 5B. The dynamics of increment and decrement of the generated voltage may not necessarily have to be the same.

FIG. 5C illustrates how the feedback loop reacts to measured current changes and causes adjustments to the applied voltage. Initially, during formation of a line being assembled by dielectrophoresis, such as a self-repairing assembly of a continuation between two broken ends of an elongate structure, prior to the growing end of the assembling continuation reaching and making electrical contact with the second broken end, the current is zero, at stage 581. During this stage, the system increases the voltage because the measured current is less than the nominal current parameter.

When the short circuit occurs at 582 as a result of the assembled continuation making electrical contact between the two broken ends and completing the circuit, the current value is measured as being above the nominal parameter, and the feedback loop system decreases the generated voltage. This results in the current through the line being decreased and stabilised towards the nominal value, as indicated by the progressively decreasing oscillations about the tempering current value indicated on the lower graph of FIG. 5C.

In practice it has been found that the maximum of the current peak during the short circuit cannot easily be controlled. This maximum value is dependent upon the generated voltage. Therefore, the voltage is decreased for the purposes of safety and limiting the risk of damage.

Although a large current is required in order to intentionally overheat the line and cause weak, narrow sections to be broken, a current with too great an amplitude will be damaging to the line. Therefore, an optimal value or range of values for the voltage and current is used, so that the line will be broken as required but can still recover and repair itself by dielectrophoresis.

Table 1 below lists parameters used to control the signal in accordance with this example according to the invention, alongside respective ranges of suitable values.

TABLE 1

| Parameter | Value |
| --- | --- |
| Number of cycles for line tempering and respective currents | 1-100 |
| Max/min voltage used to build the line | 4 V-100 V |
| Level at which we want to stabilize the current | 10 μA-10 mA |
| Voltage change ΔV | 10 μV-10 V |
| Voltage change frequency | 1 kHz-10 MHz |

An example set of parameters which may be used in a modification procedure applied to an elongate structure having a thickness of around 1 μm is: number of cycles=10; minimum/maximum voltage=1-16 V; current=0.3-3 mA; voltage change=0.1-3 V; voltage change frequency=10 MHz.

As mentioned with reference to the above-described example, it is in some applications advantageous to build a long elongate structure in steps, and apply the modification cycle procedure to each formed line segment in turn, so as to repair narrow sections, on a segment-by-segment basis. A fourth example method according to the invention is now described to demonstrate this.

It is known in the prior art to cause an elongate structure formed from assembled polarizable nanoparticles to be printed upon a substrate using a first electrode and a second electrode applying an alternating electric field to a fluid containing electrically polarizable nanoparticles deposited on the substrate, by way of moving the second electrode such that the growing end of the elongate structure continually extends towards that electrode. Although forming such a line in this manner is in many applications virtually unlimited, owing to the ability to move the second electrode and therefore print any arbitrary line morphology, when applying the self-repair technique of the present disclosure to elongate structures, it is advantageous to do so by treating shorter portions of long structures, one at a time. The time efficiency of such a forming and repairing procedure can be increased by repairing each segment of the line after it has been assembled, prior to moving on to assemble the subsequent segment.

In the present example, an elongate structure is formed upon a substrate in steps, that is segment-by-segment. The movement of the printing head is discrete, in that the printing head moves a certain length Δx. The system performing the method is configured such that the print head can only move when a current condition is fulfilled. This current condition may correspond to the target current, or the final target current in a series of tempering cycles, being reached by the current in the structure.

Figure 6:
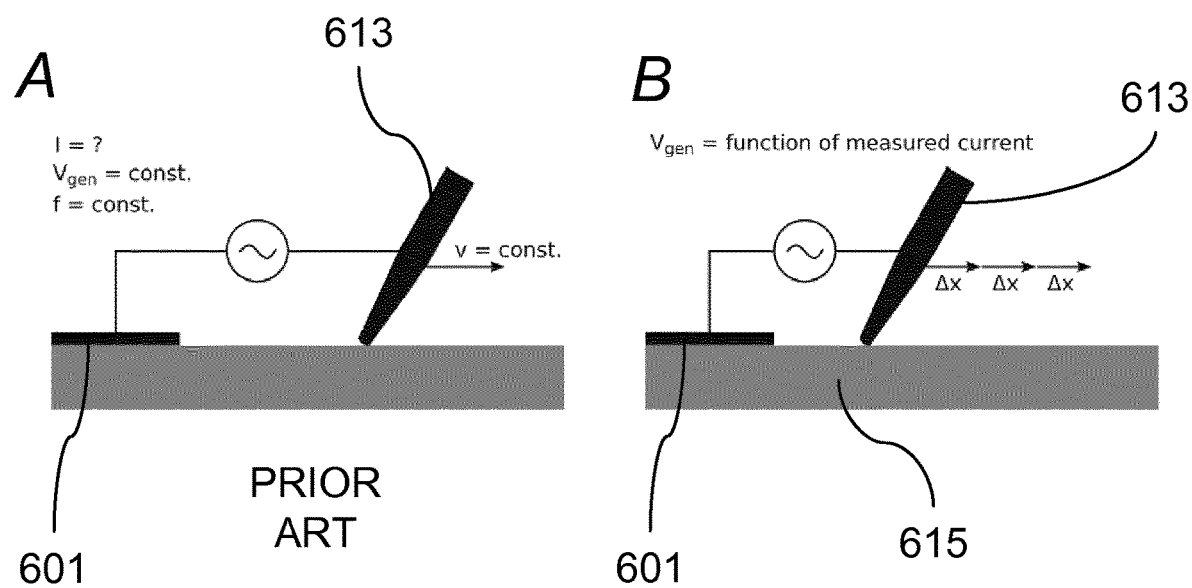
FIG. 6 is a schematic comparison of a method for forming elongate structures according to the prior art and a fourth example method according to the present invention.

The modifying process is performed for each segment. In FIG. 6 and Table 2 the fourth example method is compared with the conventional approach of the prior art.

Building and repairing a conductive line structure in a stepwise manner has a number of advantages.

Firstly, it is possible to use a much lower voltage, owing to the effect of scale, when performing the method on shorter portions of an elongate structure. It has been found that the use of a lower voltage results in growth and repair that can be more precisely controlled.

Moreover, it is easier to repair a short segment of an elongate structure than it is to repair a comparatively long segment.

Furthermore, the line can be treated as an extension of the starting electrode, that is the first or non-moving electrode, used in forming the elongate structure on the substrate. The tempering and sintering process applied to the line segment in a step-by-step manner improves the quality of each of these effective extensions, by way of reducing the length, and therefore the number of weak or narrow sections, or sections having undesired or deleterious morphology between the electrode end and the end of the segment that is distal to the electrode.

TABLE 2

| Conventional approach - static process | Present example - dynamic process |
| --- | --- |
| Constant shape and amplitude of AC and DC signals | Voltage assembling the line is modified based on the feedback loop between the generator and current measurement system |
| Constant frequency of AC signal | Variable frequency of AC signal. This allows the width of each segment to be controlled |
| Current is not controlled | Current is controlled |
| Velocity of the printing head is constant | The line is built in segments, and thus the movement of the printing head is discrete |

The condition for the printing head to move on to the next segment, in the present example, is the monitoring of a continuous complete circuit, that is a continuously flowing current through the line, with a minimum duration of $t_1$. If such a complete circuit is not achieved within a given duration, t₂, the apparatus performing the example method is configured to build the segment again, by moving the printing head back so as to begin once again the formation of an elongate structure upon that respective region of the substrate.

FIG. 6A illustrates a prior art method for forming a line. FIG. 6B depicts the method according to the present example. It can be seen that, in the prior art, electrode 613 is moved at a constant speed, whereas it is moved in a dynamic, incremental manner in the present example. Thus the elongate structure 601 is formed upon the substrate 615, and is subsequently repaired, in a stepwise manner in the present example. As is also indicated in FIG. 6A, in the prior art process, the current is not monitored.

Further conditions for the printing head to move on to subsequent segments are also envisaged. For example, during the sintering and tempering process of the modification procedure, the resistivity of the segment should decrease, as mentioned earlier in this disclosure. It may therefore be advantageous to determine that a completion condition has been fulfilled when the resistivity of a line structure 601 is monitored as being lower than a given or a predetermined completion value.

Table 3 below lists parameters and suitable values thereof for building a line segment-by-segment in accordance with the presently described example.

TABLE 3

| Parameter | Value |
| --- | --- |
| Minimal duration $t_1$ of the short-circuit before we decide to move the printing head | 1 µs-1 s |
| Maximal time $t_2$ wait for a short circuit that lasts at least $t_1$ | 1 µs-10 s |
| Length of a single segment | 1 µm-100 µm |

By forming and repairing segments having lengths between 1 µm and 100 µm, such that the segments are joined or electrically connected, to one another, an efficient, and controllable method for forming robust elongate structures, free from disadvantageous narrow sections and unlimited in length, is provided.

The invention claimed is:

1. A method of modifying an elongate structure, the method comprising:
  providing on a substrate an elongate structure formed of assembled electrically polarizable nanoparticles, the elongate structure including a narrow section to be modified;
  providing a fluid deposited onto the substrate, the fluid containing a dispersion of electrically polarizable nanoparticles and being positioned so that at least the narrow section of the elongate structure is immersed therein; and
  applying an AC voltage across a portion of the elongate structure that includes the narrow section using a first electrode in contact with the elongate structure at a first end of the portion and a second electrode in contact with the elongate structure at a second end of the portion, so as to:
    cause an alternating electric current to pass through the narrow section such that a break in the elongate structure is formed at the narrow section, the break being defined between a first broken end and a second broken end of the elongate structure, and then cause, when the break is formed, an alternating electric field to be applied to the fluid such that a plurality of the nanoparticles contained in the fluid are assembled to form a continuation of the elongate structure extending from the first broken end towards the second broken end so as to join the first and second broken ends;
  monitoring the current passing through the continuation of the elongate structure and continuing to apply the AC voltage across the portion of the elongate structure at least until the monitored current is equal to or greater than a target current;
  wherein the steps of:
    applying an AC voltage across a portion of the elongate structure that includes a narrow section,
    monitoring the AC amplitude of the current passing through the continuation of the elongate structure, and
    continuing to apply the AC voltage across a portion of the elongate structure at least until the monitored current amplitude is equal to or greater than a target current amplitude
  define one modifying cycle, and wherein the method further comprises:
    performing one or more further modifying cycles, for each of which each of the amplitude of the applied AC voltage and the target current amplitude is increased with respect to the previously performed modifying cycle.

2. The method according to claim 1, further comprising varying the applied AC voltage in accordance with the monitored current, wherein varying the applied AC voltage comprises varying one or both of the amplitude and the DC bias of the applied AC voltage.

3. The method according to claim 1, wherein the applied AC voltage is varied in accordance with a relationship between the monitored current and a predetermined tempering current.

4. The method according to any of claim 1, wherein the applied AC voltage is varied according to a feedback loop using the monitored current as feedback data.

5. The method according to claim 1, wherein the narrow section is one of a plurality of narrow sections included in the elongate structure, and wherein the AC voltage is applied so as to cause the break in the elongate structure to be formed at the most narrow of the plurality of narrow sections.

6. The method according to claim 1, further comprising, if the formed continuation is as narrow as or narrower than a target width corresponding to a width for which a section of the elongate structure will be caused to break, continuing to apply the AC voltage so as to:
  cause an alternating electric current to pass through the continuation such that a further break in the elongate structure is formed at the continuation, the break being defined between a further first broken end and a second further broken end of the elongate structure, and then
  cause, when the further break is formed, an alternating electric field to be applied to the fluid such that a plurality of the nanoparticles contained in the fluid are assembled to form a further continuation of the elongate structure extending from the first further broken end towards the second further broken end so as to join the first further broken end and second further broken end.

7. The method according to claim 1, wherein the providing of the elongate structure formed upon the substrate and the fluid deposited upon the substrate comprises:
- depositing the fluid onto the substrate so as to define a wetted region; and
- applying an alternating electric field to the fluid on the region, using a first electrode and a second electrode, so that a plurality of the nanoparticles are assembled to form the elongate structure, extending from the first electrode towards the second electrode; and
- further comprises, during the step of applying the alternating electric field, increasing the separation between the first and second electrodes by moving the second electrode away from the first electrode so as to extend further the elongate structure towards the second electrode.

8. The method for forming a compound elongate structure upon a substrate, comprising providing and modifying, according to the method of claim 7, a respective elongate structure upon each of a plurality of adjacent regions on the substrate, such that each structure is connected to at least one other structure.

9. The method according to claim 8, comprising forming and modifying each of the plurality of elongate structures in sequence, wherein the modifying of each elongate structure is continued until a completion criterion for the respective elongate structure is fulfilled.

10. The method according to claim 9 and further comprising monitoring the AC amplitude of the current passing through the continuation of the elongate structure, wherein the completion criterion comprises one or both of:
- the monitored current amplitude being equal to or greater than a predetermined completion target current amplitude for at least a predetermined duration, and
- a monitored resistance of the respective elongate structure being less than or equal to a predetermined completion resistance.

11. The method according to claim 9, comprising, if the completion criterion for a respective elongate structure is not met during a predetermined duration, repeating the forming and modifying of that structure.

12. The method according to claim 1, further wherein the elongate structure has a width less than 1 μm and a length greater than 100 μm, wherein the width of the structure at its most narrow point is greater than or equal to 70% the average width of the structure.

* * * * *